United States Patent
Xiao et al.

(10) Patent No.: US 9,269,388 B2
(45) Date of Patent: *Feb. 23, 2016

(54) CHEMICAL PINNING TO DIRECT ADDRESSABLE ARRAY USING SELF-ASSEMBLING MATERIALS

(71) Applicant: Seagate Technology LLC, Scotts Valley, CA (US)

(72) Inventors: Shuaigang Xiao, Fremont, CA (US); XiaoMin Yang, Livermore, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/673,471

(22) Filed: Mar. 30, 2015

(65) Prior Publication Data
US 2015/0206549 A1    Jul. 23, 2015

Related U.S. Application Data

(63) Continuation of application No. 12/273,791, filed on Nov. 19, 2008, now Pat. No. 8,993,060.

(51) Int. Cl.
   *G11B 5/84*        (2006.01)
   *B05D 5/00*        (2006.01)
   (Continued)

(52) U.S. Cl.
CPC *G11B 5/84* (2013.01); *B05D 1/322* (2013.01); *B05D 3/06* (2013.01); *B05D 5/00* (2013.01); *B81C 1/00031* (2013.01); *B82Y 10/00* (2013.01); *G11B 5/59633* (2013.01); *G11B 5/743* (2013.01); *G11B 5/746* (2013.01); *G11B 5/82* (2013.01); *G11B 5/855* (2013.01);
(Continued)

(58) Field of Classification Search
CPC ............. B05D 1/322; B05D 5/00; B05D 3/06
See application file for complete search history.

(56) References Cited

U.S. PATENT DOCUMENTS 6,822,833 B2    11/2004    Yang et al.
7,029,773 B2    4/2006    van de Veerdonk et al.
(Continued)

FOREIGN PATENT DOCUMENTS

JP    2007-313568 A    12/2007
JP    2008-090956 A    4/2008
(Continued)

OTHER PUBLICATIONS

M. Park, et al., "Large area dense nanoscale patterning of arbitrary surfaces," Applied Physics Letters, vol. 79, No. 2, Jul. 9, 2001, pp. 257-259.

(Continued)

*Primary Examiner* — James M Mellott
(74) *Attorney, Agent, or Firm* — Hall Estill Attorneys at Law

(57) ABSTRACT

A substrate having an arrangement of self-assembling magnetic domains and a method of fabrication therefor. In some embodiments, a substrate is patterned with a plurality of chemically contrasted alignment features, and a block copolymer having a magnetic component and a non-magnetic component is deposited onto the substrate. The block copolymer self-assembles into a sequence of magnetic domains responsive to the alignment features. The period of the alignment features is between about 2 times and about 10 times the period of the magnetic domains.

15 Claims, 10 Drawing Sheets

(51) Int. Cl.
  *B05D 1/32* (2006.01)
  *B05D 3/06* (2006.01)
  *B81C 1/00* (2006.01)
  *B82Y 10/00* (2011.01)
  *G11B 5/74* (2006.01)
  *G11B 5/82* (2006.01)
  *G11B 5/855* (2006.01)
  *G11B 5/596* (2006.01)
  *B05D 3/00* (2006.01)

(52) U.S. Cl.
  CPC .......... *B05D 3/00* (2013.01); *B81C 2201/0149* (2013.01); *Y10T 428/24802* (2015.01)

(56) References Cited

U.S. PATENT DOCUMENTS

| | | | |
|---|---|---|---|
| 7,041,394 B2 | 5/2006 | Weller et al. | |
| 7,344,773 B2 | 3/2008 | Subramanya et al. | |
| 7,351,445 B2 | 4/2008 | Haginoya et al. | |
| 7,416,991 B2 | 8/2008 | Bandic et al. | |
| 8,133,534 B2 | 3/2012 | Stoykovich et al. | |
| 8,168,284 B2 | 5/2012 | Nealey et al. | |
| 8,993,060 B2 * | 3/2015 | Xiao et al. | 427/256 |
| 2002/0132083 A1 | 9/2002 | Weller et al. | |
| 2003/0091752 A1 | 5/2003 | Nealey et al. | |
| 2003/0091865 A1 | 5/2003 | Chen et al. | |
| 2003/0194582 A1 | 10/2003 | Ishikawa et al. | |
| 2004/0071924 A1 | 4/2004 | Yang et al. | |
| 2006/0222898 A1 * | 10/2006 | Ichihara | G11B 5/855 428/826 |
| 2008/0176749 A1 | 7/2008 | Goyal | |
| 2008/0299353 A1 | 12/2008 | Stoykovich et al. | |
| 2009/0087664 A1 | 4/2009 | Nealey et al. | |
| 2009/0196488 A1 * | 8/2009 | Nealey | B81C 1/00031 382/145 |
| 2009/0308837 A1 | 12/2009 | Albrecht et al. | |
| 2012/0107583 A1 | 5/2012 | Xiao et al. | |

FOREIGN PATENT DOCUMENTS

| | | |
|---|---|---|
| JP | 2010-056257 A | 3/2010 |
| WO | 2004001756 A1 | 12/2003 |
| WO | 2006118677 A2 | 11/2006 |

OTHER PUBLICATIONS

K. Asakawa, et al., "Nano-Patterning for Patterned Media Using Block-Copolymer," Journal of Photopolymer Science and Technology, vol. 15, No. 3, 2002, pp. 465-470.

J. Liang, et al., "Nonlithographic Fabrication of Lateral Superlattices for Nanometric Electromagnetic-Optic Applications," IEEE Journal of Selected Topics in Quantum Electronics, vol. 8, No. 5, Sep./Oct. 2002, pp. 998-1008.

J.Y. Cheng, et al., "Templated Self-Assembly of Block Copolymers: Effect of Substrate Topography," Advanced Materials, vol. 15, No. 19, Oct. 2, 2003, pp. 1599-1602.

D. Sundrani, et al., "Guiding Polymers to Perfection: Macroscopic Alignment of Nanoscale Domains," NANO Letters, vol. 4, No. 2, 2004, pp. 273-276.

M. Li, et al., "Block copolymer patterns and templates," Materials Today, vol. 9, No. 9, Sep. 2006, pp. 30-39.

Specification from U.S. Appl. No. 61/005,721, filed Dec. 7, 2007.

Specification and drawings from U.S. Appl. No. 61/068,912, filed Mar. 10, 2008.

Specification from U.S. Appl. No. 61/189,085, filed Aug. 15, 2008.

\* cited by examiner

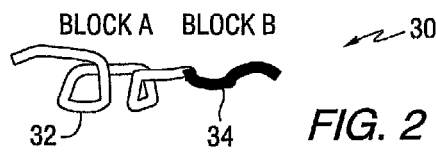
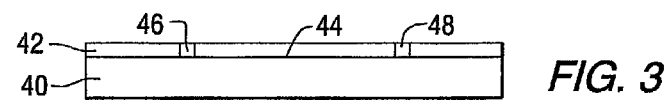
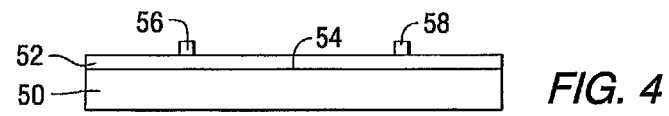
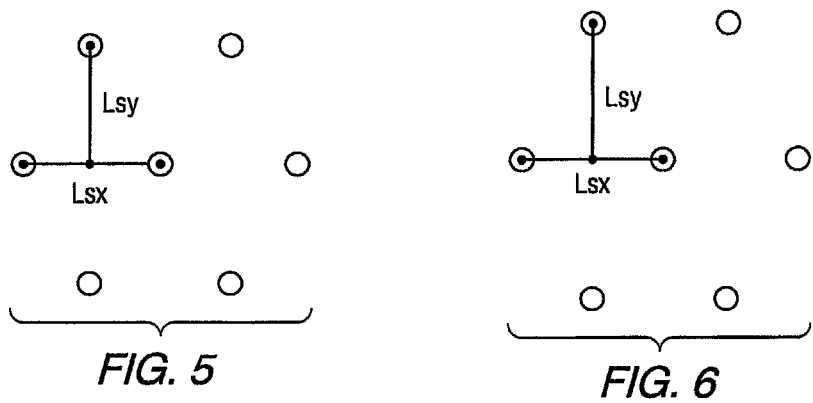
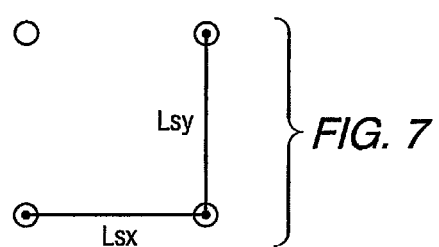

$L_s = 2n * L_0 \ (\pm 10\%),$
$n = 1, 2, \ldots, 5$ $L_s = n * L_0 \ (\pm 10\%),$
$n = 1, 2, \ldots, 10$ $L_s = n * L_0 \ (\pm 10\%),$
$n = 1, 2, \ldots, 10$

--- SUBSTRATE PATTERN
——— BLOCK COPOLYMER PATTERN

CHEMICAL PINNING TO DIRECT ADDRESSABLE ARRAY USING SELF-ASSEMBLING MATERIALS

RELATED APPLICATIONS

This application is a continuation of copending U.S. patent application Ser. No. 12/273,791 filed Nov. 19, 2008 and which issues Mar. 31, 2015 as U.S. Pat. No. 8,993,060, the contents of which are hereby incorporated by reference.

BACKGROUND

Structures having components with dimensions on a nanometer scale are being considered for use in the areas of optics, electronics, mechanics, magnetism and so forth. Nanostructures encompass various structures referred to as, for example, nanoparticles, nanotubes or quantum dots, and may potentially be used as building blocks for ordered and complex materials.

For data storage media, including bit patterned media (BPM) and discrete track media (DTM), the patterning of ultra-high density dot array or line array, with a periodicity as small as 25 nm or less is desirable. However, since optical lithography is limited by the diffraction limit, the resolution of conventional optical lithography is usually limited to about 50 nm half-pitch. Thus conventional optical lithography may not be suitable for fabricating such nanostructures for bit patterned magnetic storage media.

A high-throughput patterning method is desired for forming nanostructures on a substrate. Self-assembly technology has the potential to provide both ultrahigh-density patterning and high throughput.

SUMMARY

Various embodiments of the present disclosure are generally directed to a substrate having an arrangement of self-assembling magnetic domains and a method therefor.

In some embodiments, a method includes pattering a substrate with a plurality of chemically contrasted alignment features, and depositing a block copolymer having a magnetic component and a non-magnetic component onto the substrate. The block copolymer self-assembles into a sequence of magnetic domains responsive to the alignment features. The period of the alignment features is between about 2 times and about 10 times the period of the magnetic domains.

In other embodiments, a method includes forming a photoresist layer on a disc-shaped rigid substrate having a polymer brush layer thereon. A lithographic process is used to form a first plurality alignment features in a servo area and a second plurality of alignment features in a bit area of the photoresist layer. A self-assembling copolymer material comprising a magnetic component and a non-magnetic component is deposited on at least a portion of the bit area. The position of curvilinearly shaped domains of the self-assembled material is directed by the second plurality of alignment features to form a nanostructure pattern in the bit area having a period from two to ten times a period of the second plurality of alignment features. The curvilinearly shaped domains are formed by the magnetic component of the copolymer material.

In other embodiments, a bit patterned magnetic recording medium is formed by the foregoing steps.

BRIEF DESCRIPTION OF THE DRAWINGS

FIG. 2 is a schematic representation of a block copolymer.

FIG. 3 is a cross-sectional view of a substrate.

FIG. 4 is a cross-sectional view of a substrate.

FIGS. 5-7 are schematic representations of dot patterns.

DETAILED DESCRIPTION

Figure 1:
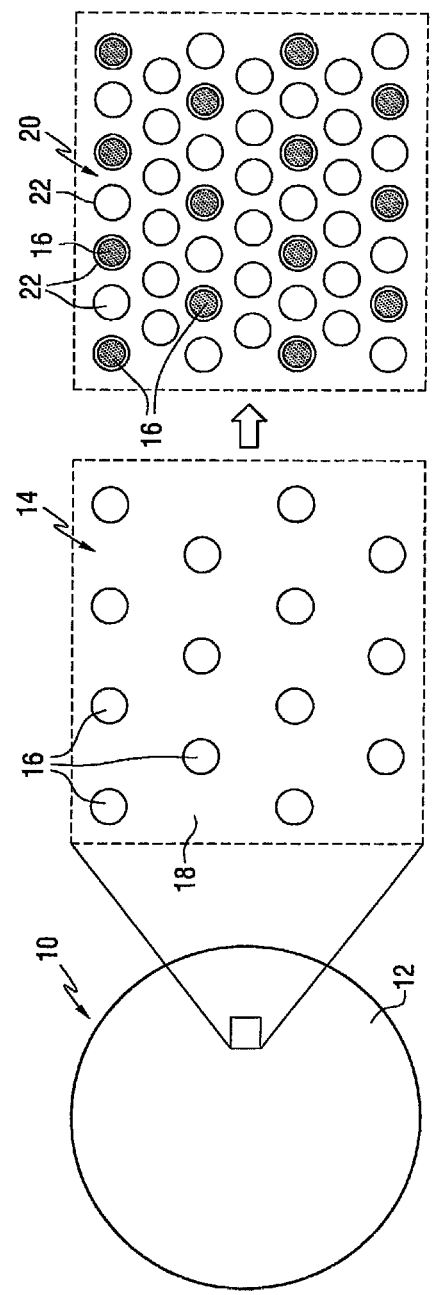
FIG. 1 is a schematic representation of a fabrication process in accordance with one aspect of the present disclosure.

The present disclosure generally relates to methods of fabricating nanostructured devices and to devices fabricated using such methods. In one aspect, the disclosure sets forth a method for achieving long-range order and precise positional control in naturally self-assembled nanostructures.

Some embodiment are directed to data storage media and the fabrication thereof. Data storage media generally include a servo area and a bit area. The servo area includes information that is used to control the position of a recording head and the timing of read and write operations. The bit area is used to store information that is written to and read from the media. In one aspect, various embodiments allow the integration of self-assembly processes into nano-imprint template fabrication of bit patterned media (BPM) for both a bit area having high-density periodic dot patterns and a servo area having medium-to-high density periodic/non-periodic dot/line patterns.

In another aspect, some embodiments use a substrate structure with a chemical contrast surface pattern that can be used to direct the self-assembly, or self-organization, of an array of nanostructures. As used in this description, a chemical contrast substrate refers to a substrate having regions or materials that exhibit different chemical preferences, or affinities, for different components of a block copolymer. The regions or materials can have little topographic difference. The regions or materials serve as alignment features that direct the self-assembly of the nanostructures. Self-assembly means the formation of periodic nanostructures of self-assembling materials, such as bloc copolymers and nanoparticles. The periodic nanostructures can form spontaneously in a relatively large area according to thermodynamic properties.

A substrate having a chemical contrast can be used to direct the positioning of block copolymer spherical or cylindrical nanodomains with domain periods of 25 nm or less, corresponding to an areal density of z 1 Tdot/in$^2$ as desired for the template fabrication of bit patterned media (BPM). Referring to the drawings, FIG. 1 schematically illustrates a fabrication process in accordance with one aspect of the disclosure.

In FIG. 1, a disc 10 includes a substrate 12 and has a surface pattern 14 formed on the substrate. The surface pattern includes a chemical contrast surface pattern having a plurality of regions 16 in or on a surface 18. The regions 16 serve as alignment features for subsequently deposited nanostructures. While only a few regions 16 are shown in FIG. 1 for clarity, it will be appreciated that many more regions 16 may be used in a practical device. The regions and surface have different affinities for material that are to be subsequently deposited on the substrate, and serve to direct the position and/or orientation of nanostructures. The regions 16 can be created by conventional lithography, such as e-beam lithography, nano-imprinting, extreme-ultraviolet (EUV) lithography, 193 nm lithography, 248 nm lithography, X-ray lithography, etc.

The half-pitch of the surface pattern 14 can be, for example, tens to hundreds of nanometers. In this example, the regions 16 have a substantially circular shape in the plane of the surface 18. The regions 16 are also referred to as dots.

A self-assembled material is used to fabricate a pattern 20, whose long-range order and positional accuracy is directed by surface pattern 14. In one example, the self-assembled pattern is fabricated using block copolymers. The components of the block copolymer will position themselves on the surface of the substrate in a pattern that is directed by the chemical contrast pattern of the substrate. One domain of the block copolymer can be removed to leave the domains 22 in the pattern 20. In one example, the remaining domains 22 have a substantially spherical shape.

The period ratio between substrate pattern and block copolymer pattern can vary in a range from 1:1 to 10:1. In addition, the lattice structure in substrate chemical contrast pattern is not necessarily the same as that in the block copolymer pattern. Furthermore, the chemical contrast pattern need not be periodic.

In one example, the size of the alignment dots 16 is smaller than the size of the block copolymer domain 22 when measured in a lateral direction, and the volume of the alignment dots is much smaller than that of the block copolymer domains.

FIG. 2 is a schematic representation of a block copolymer 30. The block copolymer includes a major component 32 and a minor component 34.

FIG. 3 is a cross-sectional view of a portion of a chemically patterned substrate 40. A polymer brush layer 42 is formed on a surface 44 of the substrate. In this example, openings 46, 48 are formed in the polymer brush layer. The substrate is formed of a material having an affinity to a first component of a block copolymer, and the polymer brush layer 42 is formed of a material having an affinity to a second component of the block copolymer. When the block copolymer is subsequently applied to the substrate, the positions of the domains of the block copolymer will be controlled by the affinities of the block copolymer components with the substrate and the polymer brush layer. The example of FIG. 3 includes a concave substrate pattern.

FIG. 4 is a cross-sectional view of a portion of a chemically patterned substrate 50. A polymer brush layer 52 is formed on a surface 54 of the substrate. In this example, nanoposts 56, 58 are formed on the polymer brush layer. The polymer brush layer is formed of a material having an affinity to a first component of a block copolymer, and the nanoposts are formed of a material having an affinity to a second component of the block copolymer. When the block copolymer is subsequently applied to the substrate, the positions of the domains of the block copolymer will be controlled by the affinities of the block copolymer components with the polymer brush layer and the nanoposts. The example of FIG. 4 includes a convex substrate pattern.

In the examples described herein, the polymer brush layer can be comprised of polystyrene (for copolymers with polystyrene as the major blocks). In the example of FIG. 4, the nanoposts can be comprised of SiOx or various metals, such as tantalum, chromium, titanium, etc.

To form the pattern, a block copolymer can be deposited on the patterned surface via spin-coating from a dilute solution in general solvents like toluene, forming monolayered spheres (for sphere-form block copolymers) or lying-down cylinders (for cylinder-form block copolymers), and one domain of the block copolymer can be removed, using one of several known techniques, to leave a plurality of nanostructures in the form of dots (or holes) or lines (or trenches).

Block copolymer nanostructures can be used to form structures having half-pitch domain sizes in the order of about 5 TIm to about 50 TIm. However, these block copolymer nanostructures usually lack long-range order. In one aspect, this disclosure addresses the poor long-range order issue by using a substrate having a surface pattern with a chemical contrast to promote long-range order in block copolymer nanostructures.

The block copolymer can include two organic blocks (e.g., polystyreneblock-polymethylmethacrylate), or one organic block and one inorganic block (e.g., polystyrene-block-polydimethylsiloxane). One of the domains can be removed by UV degradation followed by a wet rinse. For example, upon UV exposure, polymethylmethacrylate is degraded while polystyrene is cross-linked. In another example, oxygen plasma can be used to remove organic components. Polydimethylsiloxane has good resistance to oxygen plasma.

The substrate pattern with chemical contrast and customized pattern layout can be used to direct the positioning of self-assembled nanodomains with domain periods of 25 TIm or less (~1 Tdot/in$^2$). This substrate chemical pattern can be generated by various advanced lithographic techniques, such as e-beam, nano-imprint, EUV, 193 TIm, 248 TIm, X-ray, etc. Although block copolymers are used as examples here, the self-assembled material is not limited to block copolymers, and it can be any self-assembling materials with at least two chemically distinct components, e.g., chemically functionalized nanoparticles and nanotubes. In a chemically functionalized Nan particle, besides the organic Nan particle inner core, there is an outer shell comprised of organic polymer chains which have a distinct chemical property compared with the inner core. One example of a chemically functionalized Nan particle is: 3-aminopropyl-(3oxobutanoic acid) functionalized silica Nan particle. FIGS. 5-7 are schematic representations of substrate dot patterns with various periodic lattice structures, where Ls is the period (i.e., the distance between alignment dots) in substrate pattern, Lsx is the period in an X direction, and Lsy is the period in a Y direction of a Cartesian co-ordinate system.

FIG. 5 shows a hexagon pattern of alignment dots positioned such that Lsy=0.866 Lsx. FIG. 6 shows a stagger pattern of alignment dots positioned such that Lsy=Lsx. FIG. 7 shows a square pattern of alignment dots positioned such that Lsy=Lsx.

The period of the substrate pattern is not necessarily equal to the domain period (IX) in a natural block copolymer pattern, which is helpful to release the pressure of conventional lithographic technology used to generate the substrate pattern, for example bye-beam lithography or optical lithography. The natural pattern of self-assembled materials refers to the self-assembled nanostructure formed without the guidance of external fields, such as a substrate topographic pattern or chemical contrast pattern. With a method described here, only a sparse substrate pattern (e.g., chemical contrast) needs to be generated by conventional lithography, which will be used to direct a dense self-assembled pattern. Thus, self-assembly releases the resolution pressure of conventional lithography.

The pattern multiplication (i.e., the ratio of substrate pattern period and block copolymer pattern period) ranges from about one to about 10. For example, the ratio of 10 can be used if a single grain of 1 O×10 block copolymer domains can be typically formed in a natural block copolymer nanopattern without any surface guidance and thus in the form of multigrain structures.

Such a pattern multiplication is useful for patterned media fabrication having an areal dots density of 1-2 $Tdot/in^2$ and beyond. The patterning resolution of this method is only limited by the properties of available self-assembling materials, which have half-pitch dimensions of about 4 nm to about 50 nm for block copolymers, about 3 run to about 10 run for nanoparticles, and about 1 run to about 5 run for nanotubes, corresponding to areal densities 1-50 $Tdot/in^2$.

Figure 10:
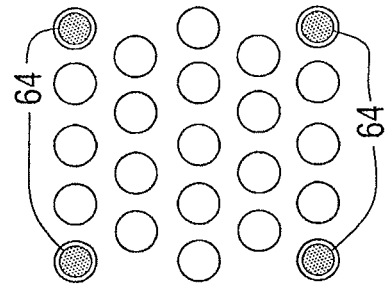
FIGS. 8-11 are schematic representations of portions of patterned media constructed in accordance with some aspects of the present disclosure.
Figure 9:
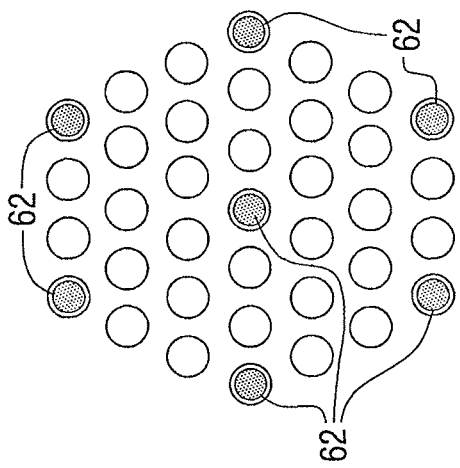
Figure 8:
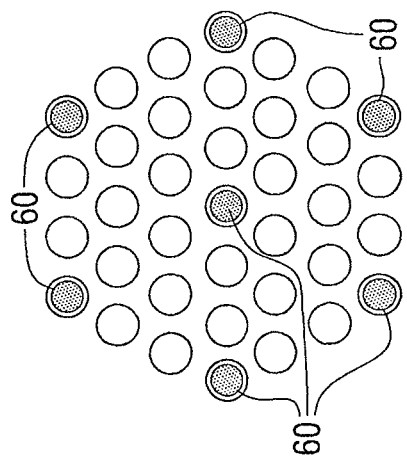

FIGS. 8-10 are schematic representations of block copolymer patterns directed by periodic substrate patterns with same or different lattice structures.

FIG. 8 shows a pattern of nanostructures formed on a substrate having alignment dots at the positions indicated by item number 60. The alignment dots are positioned such that Lsy=0.866 Lsx. FIG. 8 shows a hexagonal pattern of alignment dots with 3 times (3X) multiplication, wherein Ls=nLo (±10%), for n=1, 2, . . . , 10, and where Lo is the period in a natural (i.e., un-directed) block copolymer pattern. However, the pattern of alignment dots in FIG. 8 is not limited to a 3× multiplication.

FIG. 9 shows a pattern of nanostructures formed on a substrate having alignment dots at the positions indicated by item number 62. The alignment dots are positioned such that Lsy=Lsx. FIG. 9 shows a stagger pattern of alignment dots with 3× multiplication, wherein Ls=nLo(±10%), for n=1, 2, . . . , 10. However, the pattern of alignment dots in FIG. 9 is not limited to a 3× multiplication.

FIG. 8 shows a pattern of nanostructures formed on a substrate having alignment dots at the positions indicated by item number 64. The alignment dots are positioned such that Lsy=Lsx.

FIG. 10 shows a square pattern of alignment dots with 4 times (4×) multiplication, wherein Ls=2nLo(±10%), for n=1, 2, . . . , 5. However, the pattern of alignment dots in FIG. 10 is not limited to a 3× multiplication.

In the structures of FIGS. 8-10, a natural lattice structure is assumed to be obtainable in a block copolymer pattern without any substrate guidance.

The lattice structure of the substrate pattern can also be different from that of naturally self-assembled structures. For example, substrate patterns with hexagon, stagger, or square array are all able to align block copolymer spherical/cylindrical domains with a naturally hexagon lattice. Furthermore, the substrate pattern need not be periodic, as long as it can direct long-range ordering of block copolymer domain structures by pinning some block copolymer nanodomains to the underlying substrate at some spots.

Figure 11:
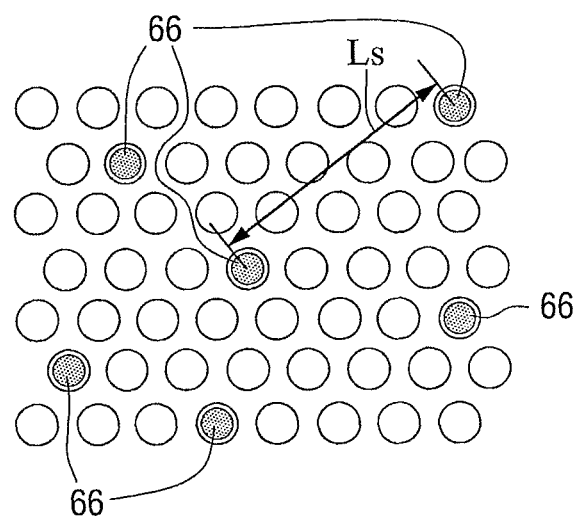

FIG. 11 is a schematic representation of a block copolymer pattern directed by a non-periodic substrate pattern having alignment dots at the positions indicated by item number 66. In this example, the average dimension for Ls is <Ls>, and <Ls> is in a range from about 2 Lo to about 10 Lo.

The substrate pattern can be created by optical lithography. A substrate having a chemical contrast surface can include alternating hydrophobic/hydrophilic regions or alternating polar/non-polar regions having a distinct affinity to distinct blocks in the copolymer.

Self-assembled nanodot arrays can be directed by a substrate chemical pattern with pattern pitches that are much larger than the pitches of the nanodot array. By using a carefully designed self-assembly system, a spherical block copolymer self-assembled on a substrate hexagon dot pattern with a low-topography chemical contrast, highly addressable block copolymer dot arrays with 24 nm pitch (1.3 $Tdot/in^2$) directed by substrate dot arrays with a periodicity of 24 nm/48 nm/72 nm/96 nm have been fabricated. In addition, directed >2 $Tdot/in^2$ dot arrays have also been successfully demonstrated. In this example, the dots are arranged in the array format of FIG. 5.

While others have studied perpendicularly oriented cylindrical block copolymers, a neutral surface wetting condition is required to achieve domain orientation perpendicular to both substrate/copolymer interface and copolymer/air interface in the case of cylindrical block copolymers. In one aspect, this disclosure includes a spherical block copolymer without the concern of neutral surface wetting to generate an addressable dot array, which is in thermodynamic equilibrium and thus intrinsically has a low defect density and long-term stability.

Figure 12:
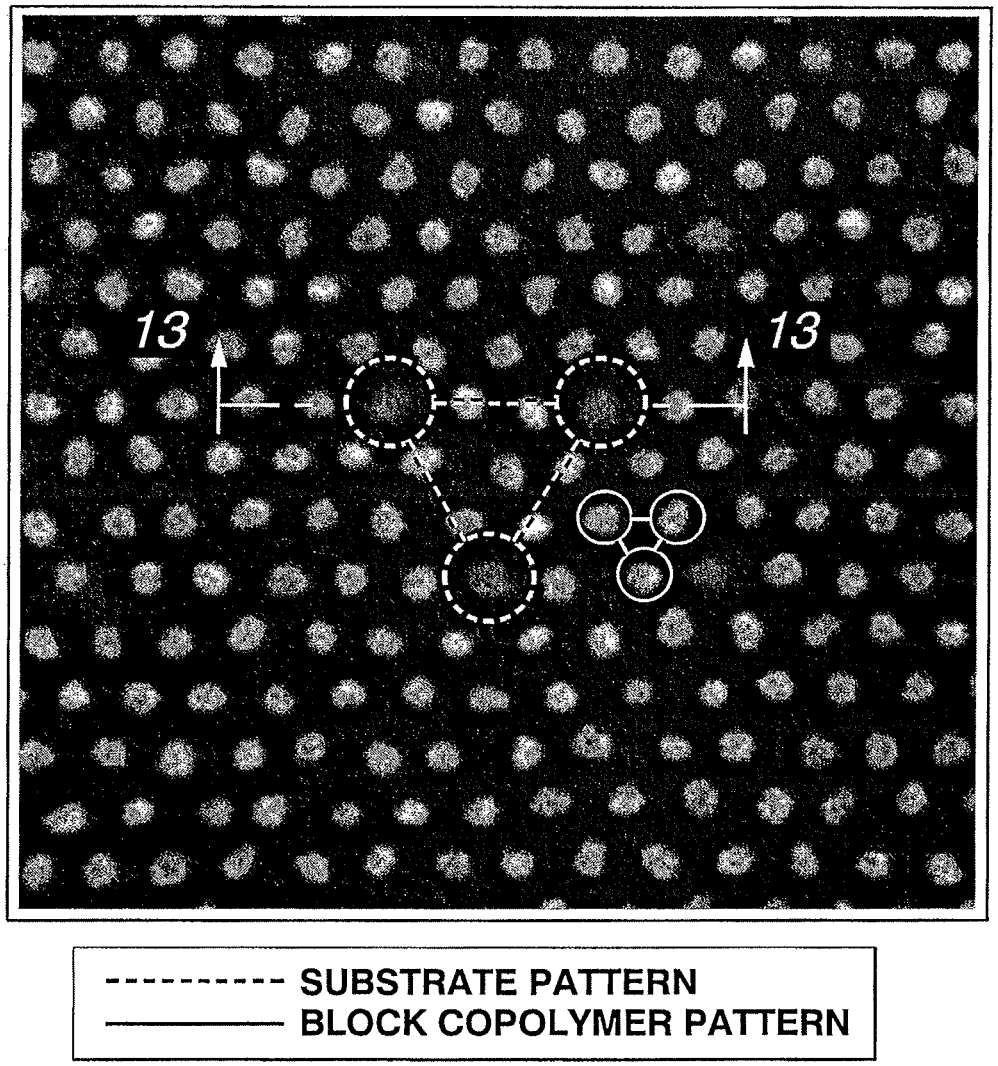
FIG. 12 is a photomicrograph of a portion of a patterned media in accordance with an aspect of the present disclosure.

FIG. 12 is a photomicrograph of a portion of a patterned media in accordance with an aspect of the present disclosure. FIG. 12 shows a 1.3 $Tdot/in^2$ spherical PSPDMS block copolymer pattern directed by a hexagon substrate pattern with 3× period.

Figure 13:
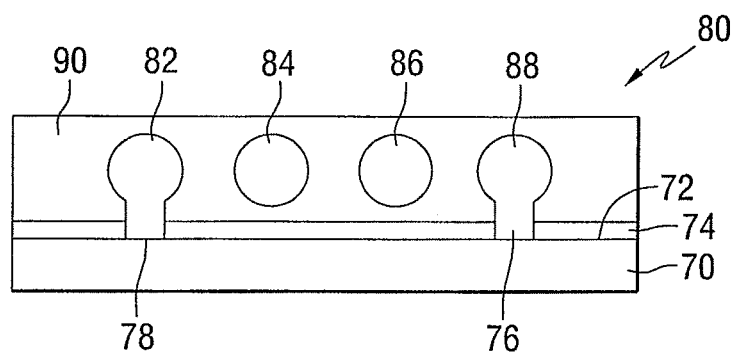
FIG. 13 is a schematic cross-sectional view of a portion of another patterned media constructed in accordance with an aspect of the present disclosure.

FIG. 13 is a schematic cross-sectional view of a portion of a patterned media similar to that shown in FIG. 12. In the example of FIG. 13, a substrate 70 with a chemically contrasting surface 72 includes a polymer brush layer 74 and openings 76, 78 in the polymer brush layer. A block copolymer 80 is deposited on the chemically contrasting surface. The block copolymer includes a plurality of substantially spherical domains 82, 84, 86 and 88 of a first component in a second component 90. Domains 82 and 88 have an affinity to the substrate and therefore form at the locations of the openings in the brush layer.

Figure 14:
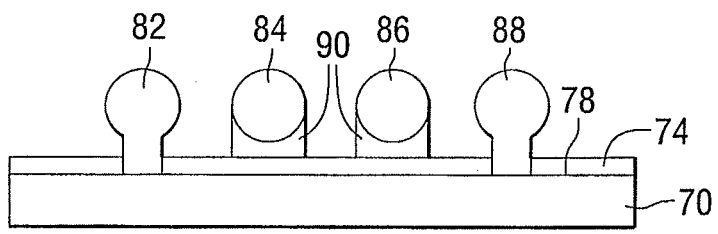
FIG. 14 is a schematic cross-sectional view of a portion of another patterned media constructed in accordance with an aspect of the present disclosure.

FIG. 14 is a schematic cross-sectional view of the portion of the patterned media of FIG. 13, after the second component has been substantially removed.

Figure 15:
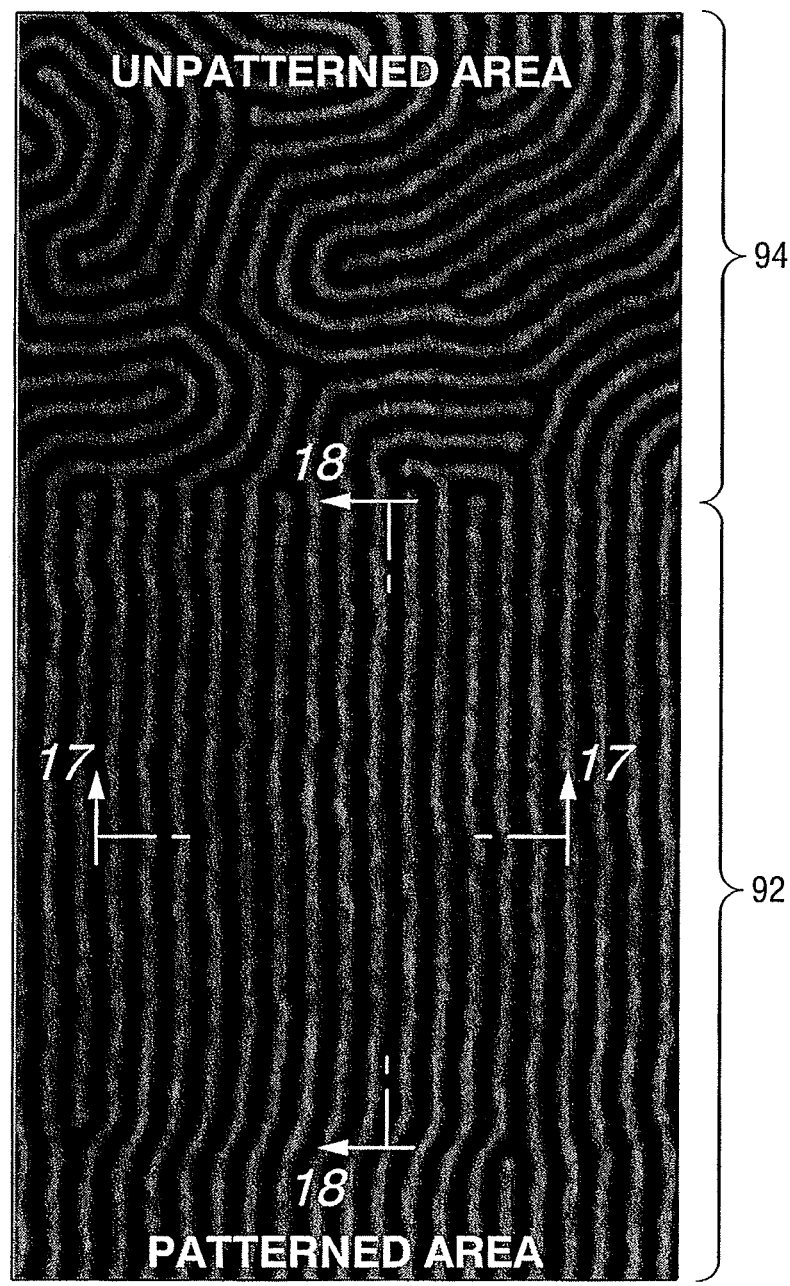
FIG. 15 is a photomicrograph of a portion of another patterned media in accordance with an aspect of the present disclosure.

In another aspect of the present disclosure, by combining a substrate chemical pattern with a cylindrical block copolymer, highly ordered dense line patterns can be fabricated. FIG. 15 is a photomicrograph of a cylindrical poly(styrene-dimethyl siloxane) (PS-PDMS) block copolymer pattern directed by a substrate dot pattern. FIG. 15 shows a patterned portion 92 and an unpatterned portion 94, without an underlying substrate pattern. There is no obvious domain orientation in the unpatterned area.

Figure 16:
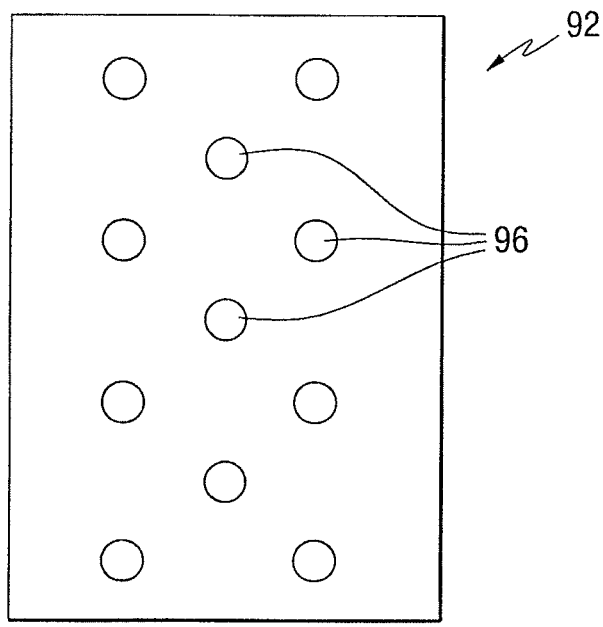
FIG. 16 is a plan view of a patterned surface that can be used in the fabrication of the patterned media of FIG. 15.

The chemical contrast pattern on the substrate includes a plurality of dots 96 as shown in FIG. 16. In the pattern of FIG. 16, Ls=n.J3Lo(±10%), with n=1, 2, . . . , 5, and where Lo is the period in natural (i.e., un-directed) block copolymer pattern.

When a cylindrical block copolymer is deposited on the patterned surface, the cylinders attach to the pattern dots and lie in a direction substantially parallel to the patterned surface.

Figure 17:
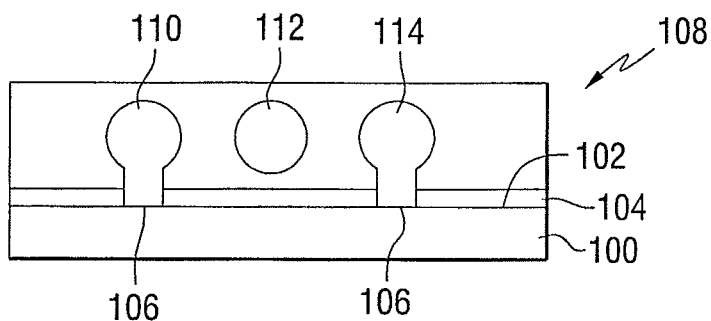
FIGS. 17-19 are schematic representations of a cross-section of another patterned media constructed in accordance with an aspect of the present disclosure.
Figure 18:
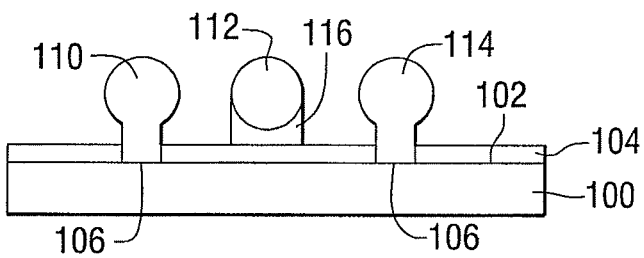
Figure 19:
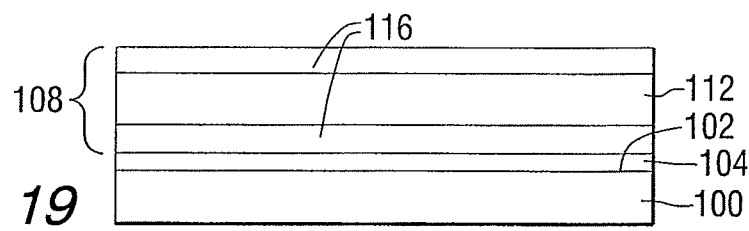

FIGS. 17-19 are schematic representations of a cross-section of a patterned media constructed with a cylindrical block copolymer in accordance with an aspect of the present disclosure.

FIG. 17 shows a cross-sectional schematic view in cross-track direction. In the example of FIG. 17, a substrate 100 with a chemically contrasting surface 102 includes a polymer brush layer 104 and openings 106 in the polymer brush layer. A cylindrical block copolymer 108 is deposited on the chemically contrasting surface. The block copolymer includes a plurality of substantially cylindrical domains 110, 112 and 114 of a first component in a second component 116. Domains 110 and 114 have an affinity to the substrate and therefore form at the locations of the openings in the brush polymer layer.

FIG. 18 is a schematic cross-sectional view of the portion of the patterned media of FIG. 17, after the second component has been substantially removed.

FIG. 19 is a cross-sectional schematic view of the structure of FIG. 18 in the down-track direction.

The block copolymer materials can be any spherical (for a dot array of nanostructures) or cylindrical (for a dot or line array of nanostructures) block copolymers with two (or more) highly immiscible blocks/components, A and B (or more), which can form nanostructures with domain spacings of 25 nanometers, nm or less, such as polystyrene polymethylmethacrylate (PS-PMMA) (down to ~20-25 nm), poly(styrene-dimethyl siloxane) (PS-PDMS)(down to about 10 nm), polystyrene-poly(ethylene oxide) (PS-PEO) (down to about 15 nm), PS-P2VP (down to about 12 nm), polystyrene-block-poly (4-vinylpyridine) (PS-P4VP) (down to about 15 nm), etc.

In one example, the block copolymer nanostructure can be directly used as a recording media if one component/block includes magnetic elements, such like cobalt, iron, etc.

Figure 20:
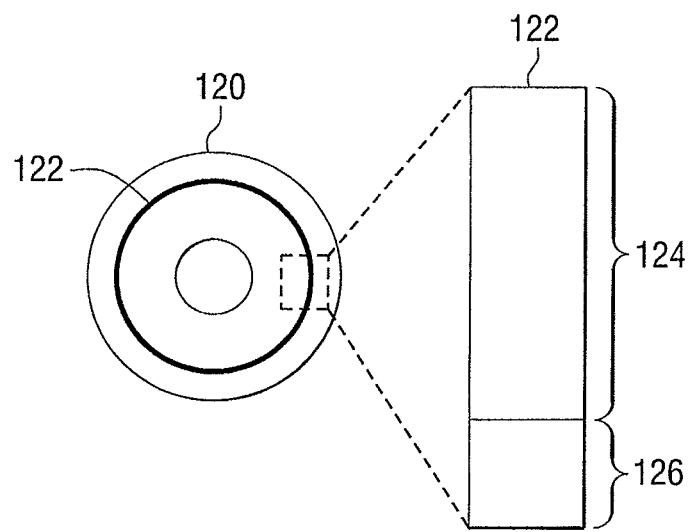
FIG. 20 is a schematic representation of a data storage disc template in accordance with an aspect of the present disclosure.

The self-assembled nanodomains can be integrated into BPM nanoimprint template fabrication including both a regular bit pattern and a non-regular servo pattern as shown in FIG. 20.

FIG. 20 is a schematic representation of a data storage disc template 120 in accordance with an aspect of the present disclosure. The disc template includes a plurality of tracks 122, only one of which is shown. Each track includes a plurality of data bit areas 124, and a plurality of servo areas 126. The data bit areas can be fabricated using the process described herein. The servo areas can be fabricated using a lithographic process, such as e-beam writing.

Figure 21:
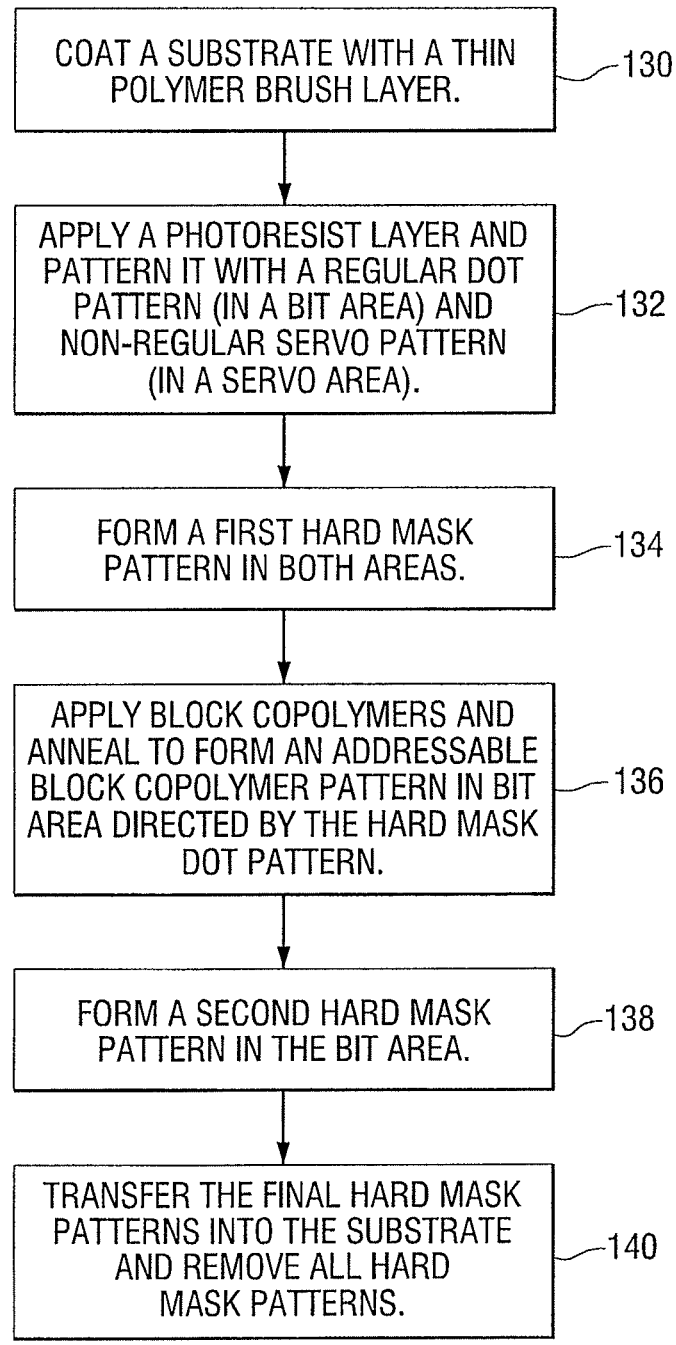
FIG. 21 is a flow diagram that illustrates the method of an aspect of the present disclosure.

FIG. 21 is a process flow diagram illustrating a method for using directed self-assembled block copolymer nanostructures in BPM template fabrication including both a bit pattern and a servo pattern. In this method, e-beam writing (EBW) is used to generate a servo pattern in the servo area, and a self-assembly material/process is used to prepare a high-density dot array in the bit area. Block 130 shows that the method starts by coating a substrate with a thin polymer brush layer. In one example, the thin polymer brush layer can have a thickness of about 1 nm to about 10 nm.

The thin polymer brush layer is then coated with a photoresist layer having, for example, a thickness of about 20 nm to about 50 nm. The photoresist can be patterned using known techniques to include a regular dot pattern (in a bit area) and a non-regular servo pattern (in a servo area). The photoresist can be patterned using, for example, e-beam lithography, optical lithography, etc. (block 132).

Next, a first evaporation and liftoff process can be used to form a first hard mask pattern in both the bit and servo areas (using for example, chromium, tantalum, etc.).

The regular dot pattern in the bit area will be used as a substrate pattern to guide a subsequently applied block copolymer pattern and the non-regular servo pattern in servo area will be used as final servo pattern (block 134).

Block 136 shows that the block copolymers are coated and annealed (e.g., via a thermal/solvent process) to form a highly ordered block copolymer pattern in the bit area directed by the hard mask dot pattern formed previously.

Block 138 shows that a second evaporation and liftoff process can be used to form a second hard mask pattern in the bit area, which may partially overlap with a first hard mask pattern in some spots.

Next, the final hard mask patterns, including a bit pattern (from the second hard mask pattern) and a servo pattern (from the first hard mask pattern) are transferred into the substrate (that may be quartz, for an ultraviolet (UV) imprint) by etching (or other methods), and all hard mask patterns can be removed by a wet etch, as shown in block 140.

The method illustrated in FIG. 21 can be integrated into the fabrication of BPM nanoimprint master templates including both a bit pattern (having a regular period, high pattern density, single shape, tight size/position sigma) and a servo pattern (that can be non-periodic or periodic, with a moderate-to-high pattern density, flexible shape, etc.). A directed self-assembled pattern can be used for the bit region and an e-beam defined pattern can be used for the servo region.

The block copolymer can include two organic blocks (e.g., polystyreneblock-polymethylmethacrylate) or one organic block, one inorganic block (e.g., polystyrene-block-polydimethylsiloxane). One of the domains can be removed by UV degradation followed by a wet rinse. For example, upon UV exposure, polymethylmethacrylate is degraded while polystyrene is cross-linked. In another example, oxygen plasma can be used to remove organic components in a hybrid organic/inorganic block copolymer. The inorganic block (i.e., polydimethylsiloxane) has good resistance to oxygen plasma.

In one example, spherical block copolymers are directed by a chemical contrast substrate pattern with a customized dot pattern layout to generate highly ordered dense dot arrays with ultra-high pattern densities.

In another example, cylindrical block copolymers are directed by a chemical contrast substrate pattern with a customized dot pattern layout to generate highly ordered line arrays with high pattern densities.

In one aspect, the highly ordered dot array generated by using the directed self-assembly method described above can be integrated with an e-beam lithography process to fabricate a full-disc BPM template including both a servo pattern and a bit pattern.

In another aspect, this disclosure provides apparatus fabricated using one of the described methods.

While the present disclosure has set forth various aspects described in terms of several examples, it will be apparent to those skilled in the art that various changes can be made to the disclosed examples without departing from the scope of the disclosure as defined by the following claims. The implementations described above and other implementations are within the scope of the claims.

What is claimed is:

1. A method comprising:
    patterning a substrate with a plurality of chemically contrasted alignment features; and
    depositing a block copolymer having a magnetic component and a non-magnetic component onto the substrate, the block copolymer self-assembling into a sequence of magnetic domains responsive to the alignment features, the period of the alignment features being between about 2 times and about 10 times the period of the magnetic domains.

2. The method of claim 1, wherein the patterning step comprises applying a polymer brush layer to the substrate, coating the brush layer with a photoresist layer and applying a lithographic process to form the plurality of chemically contrasted alignment features.

3. The method of claim 1, in which the magnetic domains are spherical.

4. The method of claim 1, in which the magnetic domains are characterized as cylinders.

5. The method of claim 1, in which the alignment features comprise a regular pattern in a data area and a non-regular pattern in a servo area.

6. The method of claim 1, in which the magnetic domains are formed by the magnetic component of the copolymer and the method further comprises subsequently removing the non-magnetic component of the copolymer.

7. The method of claim 1, wherein the alignment features are smaller than the magnetic domains.

8. A method comprising:
forming a photoresist layer on a disc-shaped rigid substrate having a polymer brush layer thereon;
using a lithographic process to form a first plurality alignment features in a servo Area and a second plurality of alignment features in a bit area of the photoresist layer; and
depositing a self-assembling copolymer material comprising a magnetic component and a non-magnetic component on at least a portion of the bit area, the position of curvilinearly shaped domains of the self-assembled material directed by the second plurality of alignment features to form a nanostructure pattern in the bit area having a period from two to ten times a period of the second plurality of alignment features, the curvilinearly shaped domains formed by the magnetic component of the copolymer material.

9. The method of claim 8, wherein the first plurality of alignment features define servo data to facilitate recording of data to the domains defined by the nanostructure pattern.

10. The method of claim 8, further comprising using the bit area to store data and the servo area to provide servo positioning information on a bit patterned medium (BPM) rotatable data recording disc in a data storage device.

11. The method of claim 8, further comprising using the bit area and the servo area as a template to form a population of nominally identical bit patterned medium (BPM) rotatable data recording discs.

12. The method of claim 8, wherein the brush layer has a thickness of from about 1 nanometer (nm) to about 10 nm and the photoresist layer has a thickness of from about 20 nm to about 50 nm.

13. The method of claim 8, further comprising removing the non-magnetic component of the self-assembling material.

14. The method of claim 8, wherein the curvilinearly shaped domains are spherical.

15. The method of claim 8, in which the curvilinearly shaped domains are characterized as cylinders.

* * * * *